(12) United States Patent
Murakami et al.

(10) Patent No.: US 10,249,564 B2
(45) Date of Patent: Apr. 2, 2019

(54) ELECTRONIC COMPONENT MOUNTING SUBSTRATE, ELECTRONIC DEVICE, AND ELECTRONIC MODULE

(71) Applicant: KYOCERA Corporation, Kyoto-shi, Kyoto (JP)

(72) Inventors: Kensaku Murakami, San Diego, CA (US); Yousuke Moriyama, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/680,347

(22) Filed: Aug. 18, 2017

(65) Prior Publication Data

US 2018/0061751 A1    Mar. 1, 2018

(30) Foreign Application Priority Data

Aug. 25, 2016 (JP) ................. 2016-164771

(51) Int. Cl.
| | |
|---|---|
| *H01L 23/498* | (2006.01) |
| *H01L 23/057* | (2006.01) |
| *H01L 23/13* | (2006.01) |
| *H01L 23/00* | (2006.01) |

(52) U.S. Cl.
CPC ...... *H01L 23/49838* (2013.01); *H01L 23/057* (2013.01); *H01L 23/13* (2013.01); *H01L 23/49827* (2013.01); *H01L 23/49805* (2013.01); *H01L 23/49822* (2013.01); *H01L 24/13* (2013.01); *H01L 24/16* (2013.01); *H01L 24/48* (2013.01); *H01L 2224/1329* (2013.01); *H01L 2224/13101* (2013.01); *H01L 2224/13144* (2013.01); *H01L 2224/16225* (2013.01); *H01L 2224/16227* (2013.01); *H01L 2224/48091* (2013.01); *H01L 2224/48105* (2013.01); *H01L 2224/48227* (2013.01); *H01L 2924/00014* (2013.01); *H01L 2924/12041* (2013.01); *H01L 2924/12043* (2013.01); *H01L 2924/14* (2013.01); *H01L 2924/15153* (2013.01); *H01L 2924/15192* (2013.01); *H01L 2924/15323* (2013.01); *H01L 2924/1631* (2013.01); *H01L 2924/16195* (2013.01); *H01L 2924/16251* (2013.01)

(58) Field of Classification Search
CPC . H01L 23/49838; H01L 23/057; H01L 23/13; H01L 23/49827
See application file for complete search history.

(56) References Cited

U.S. PATENT DOCUMENTS

2017/0186680 A1* 6/2017 Nishimura ........ H01L 23/49838

FOREIGN PATENT DOCUMENTS

JP    2006-049551 A    2/2006

* cited by examiner

*Primary Examiner* — Jose R Diaz
(74) *Attorney, Agent, or Firm* — Volpe and Koenig, P.C.

(57) ABSTRACT

An electronic component mounting substrate includes an insulating base having a rectangular shape in plan view and including a first main surface, a second main surface facing the first main surface, and a recess open on the first main surface, a band-shaped metal layer on a sidewall of the recess, and an electrode extending from a bottom surface of the recess into the insulating base. The electrode has an end disposed in the insulating base, and the end includes an inclined portion inclined toward the second main surface.

11 Claims, 10 Drawing Sheets

ELECTRONIC COMPONENT MOUNTING SUBSTRATE, ELECTRONIC DEVICE, AND ELECTRONIC MODULE

BACKGROUND OF THE INVENTION

1. Field of the Invention

The present invention relates to an electronic component mounting substrate, an electronic device, and an electronic module.

2. Description of the Related Art

In a known electronic component mounting substrate and electronic device of the related art, an electronic component is mounted on a main surface of an insulating base (see, for example, Japanese Unexamined Patent Application Publication No. 2006-049551).

In the electronic component mounting substrate, the insulating base includes a recess and an electrode on a bottom surface of the recess.

A recent increase in functionality and compactness of an electronic device has been linked to a reduction in the size of an electrode on a bottom surface of a recess. An end of the electrode extending into an insulating base to improve bonding strength between the electrode and the insulating base may easily cause a gap between insulating layers of the insulating base around the electrode, for example, which may lead to a reduction in the airtightness of the sidewall of the recess.

SUMMARY OF THE INVENTION

According to an aspect of the present invention, electronic component mounting substrate includes an insulating base having a rectangular shape in plan view and including a first main surface, a second main surface facing the first main surface, and a recess open on the first main surface, a band-shaped metal layer on a sidewall of the recess, and an electrode extending from a bottom surface of the recess into the insulating base. The electrode has an end disposed in the insulating base, and the end includes an inclined portion inclined toward the second main surface. This configuration enables the electronic component mounting substrate to suppress a gaps between insulating layers of the insulating base around the electrode, for example, by reducing the thickness of the electrode due to the presence of the inclined portion at the end of the electrode and burying the inclined portion toward the second main surface of the insulating base, suppress a reduction in airtightness around the electrode inside the insulating base, and suppress a reduction in airtightness around the recess.

According to another aspect of the present invention, an electronic device includes the electronic component mounting substrate having the configuration described above and an electronic component on the electronic component mounting substrate. Accordingly, the electronic device can have good long-term reliability.

According to still another aspect of the present invention, an electronic module includes a module substrate including a connection pad, and the electronic device having the configuration described above. The electronic device is connected to the connection pad via solder. Accordingly, the electronic module can have good long-term reliability.

DESCRIPTION OF THE PREFERRED EMBODIMENTS

Some exemplary embodiments of the present invention will be described with reference to the accompanying drawings.

First Embodiment

Figure 3A:
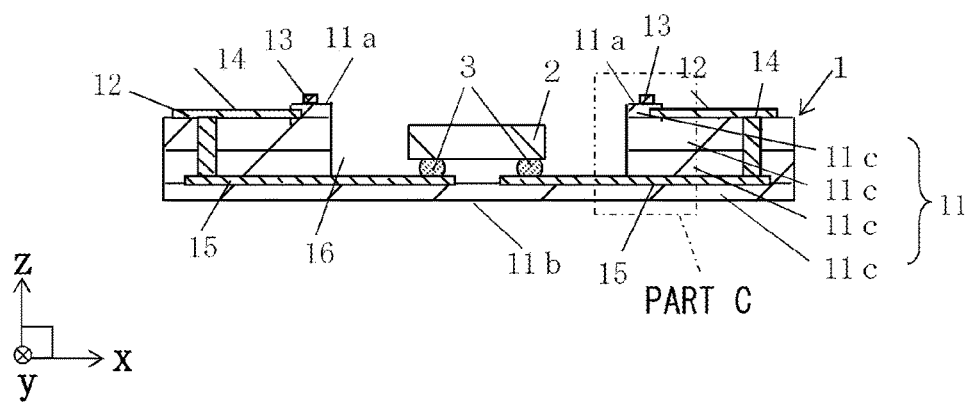
FIG. 3A is a longitudinal sectional view of the electronic device illustrated in FIG. 1A, taken along line A-A.
Figure 3B:
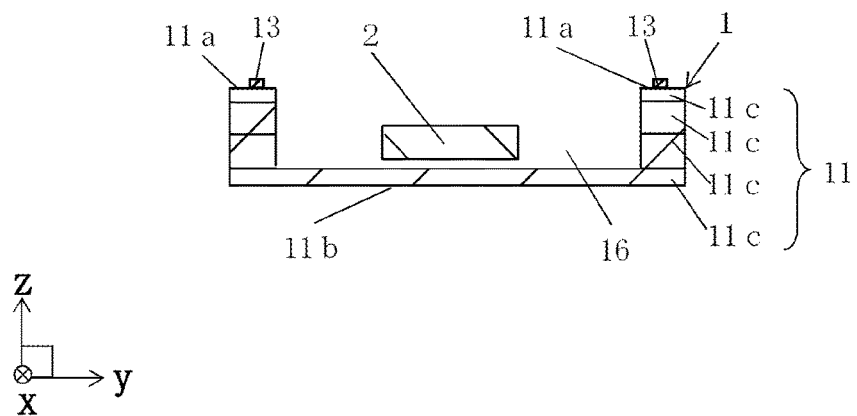
FIG. 3B is a longitudinal sectional view of the electronic device illustrated in FIG. 1A, taken along line B-B.
Figure 3C:
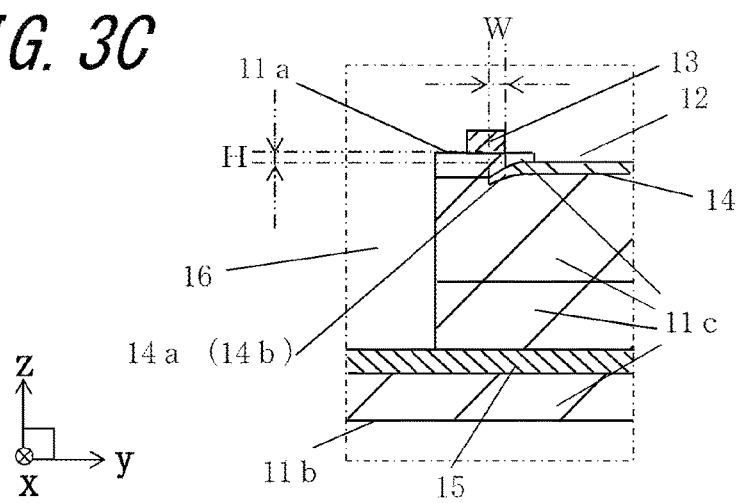
FIG. 3C is an enlarged longitudinal sectional view of part C of the electronic device illustrated in FIG. 3A.
Figure 4:
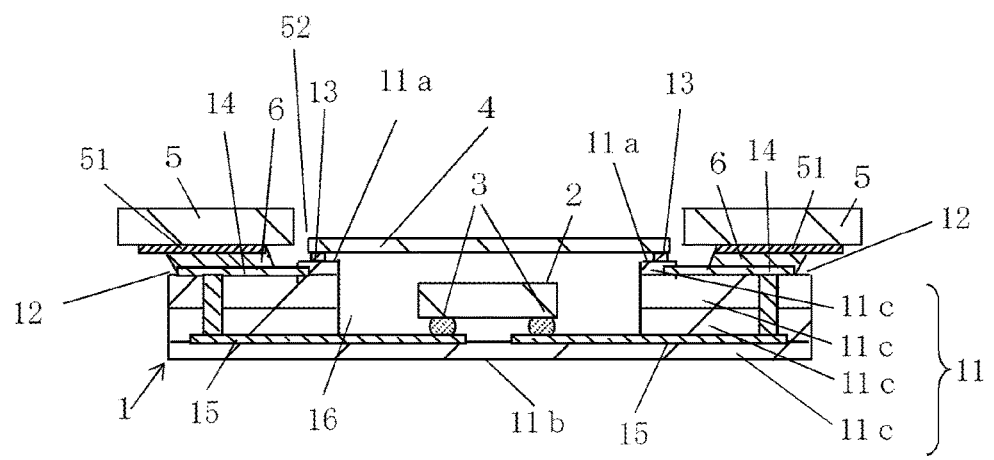
FIG. 4 is a longitudinal sectional view of an electronic module formed by mounting the electronic device illustrated in FIGS. 1A and 1B on a module substrate.
Figure 4:
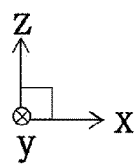
Figure 5A:
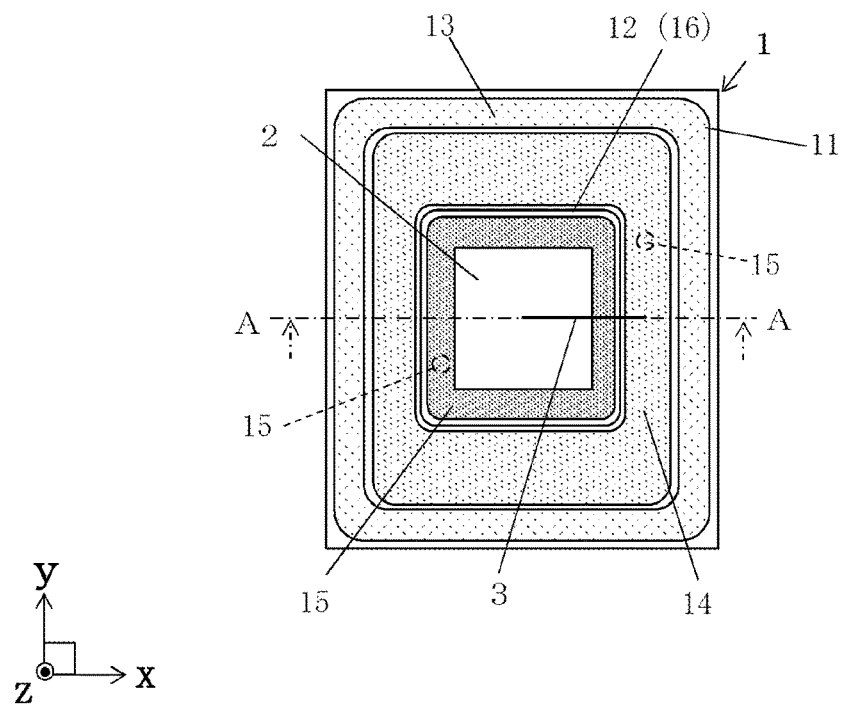
FIG. 5A is a top face view of an electronic device according to a second embodiment of the present invention.
Figure 5B:
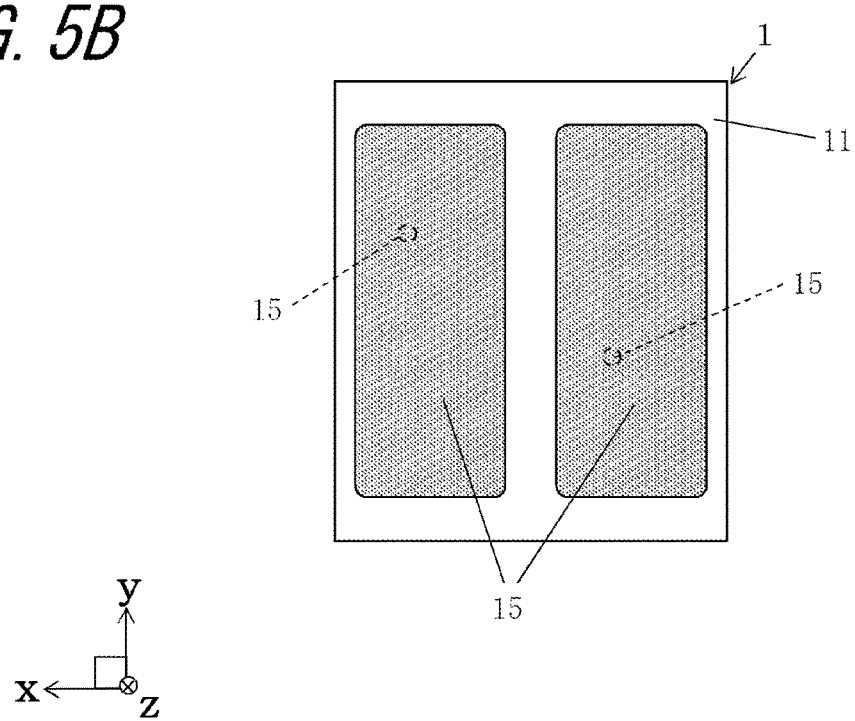
FIG. 5B is a bottom face view of FIG. 5A.
Figure 6:
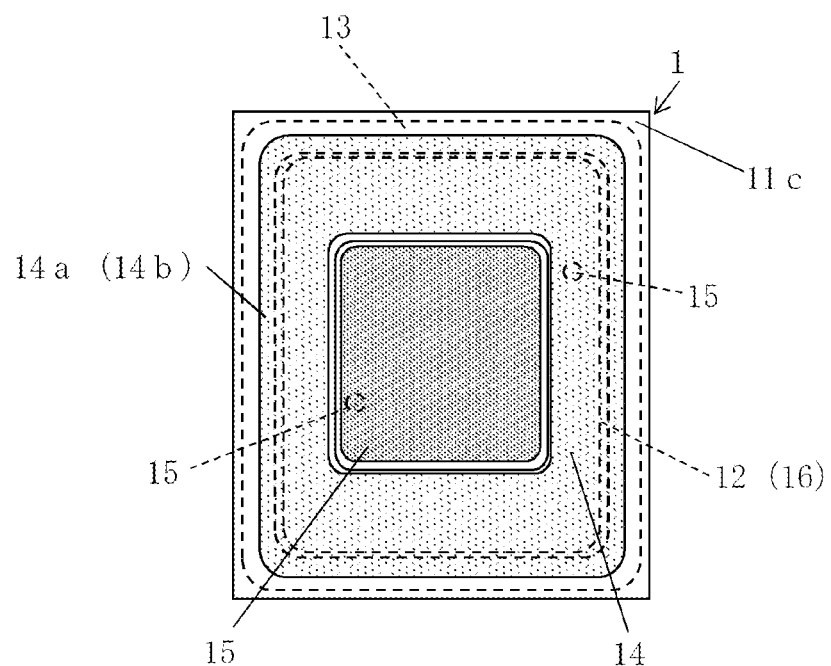
FIG. 6 is an internal top face view of electrodes on an electronic component mounting substrate illustrated in FIGS. 5A and 5B.
Figure 6:
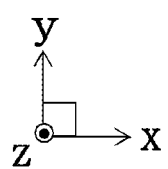
Figure 7A:
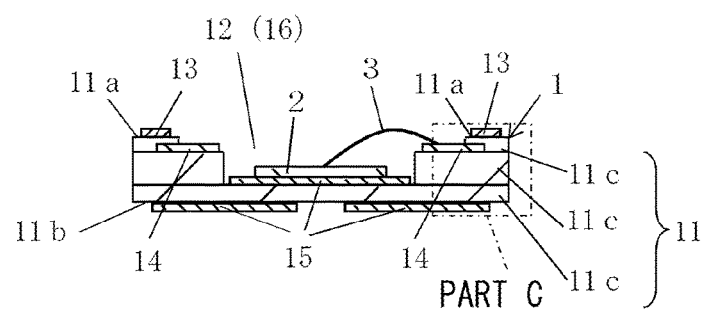
FIG. 7A is a longitudinal sectional view of the electronic device illustrated in FIG. 5A, taken along line A-A.
Figure 7A:
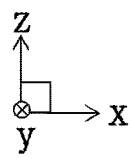
Figure 7B:
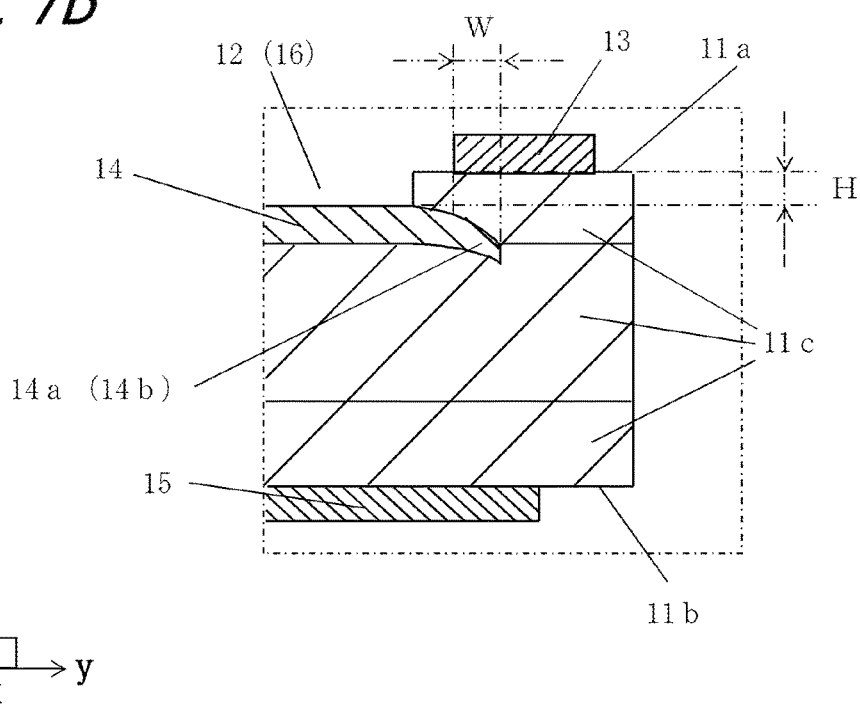
FIG. 7B is an enlarged longitudinal sectional view of part C of the electronic device illustrated in FIG. 7A.

As illustrated in FIGS. 1A to 4, an electronic device according to a first embodiment of the present invention includes an electronic component mounting substrate 1 and an electronic component 2 on the electronic component mounting substrate 1. As illustrated in FIG. 4, for example, the electronic device is connected to a module substrate 5 forming an electronic module by using solder 6.

The electronic component mounting substrate 1 according to this embodiment includes an insulating base 11 having a rectangular shape in plan view and including a first main surface 11a, a second main surface 11b facing the first main surface 11a, and a recess 12 open on the first main surface 11a, a band-shaped metal layer 13 on a sidewall of the recess 12, and an electrode 14 extending from a bottom surface of the recess 12 into the insulating base 11. A wiring conductor 15 is disposed in the insulating base 11 and on a surface of the insulating base 11. The insulating base 11 further includes a cavity 16 open on the first main surface 11a. The electrode 14 has an end 14a disposed in the insulating base 11. The end 14a of the electrode 14 includes an inclined portion 14b inclined toward the second main surface 11b. In FIGS. 1A to 4, the upward direction is taken to be the direction of the positive imaginary z-axis. In the following description, the distinction between upper and lower is for convenience of illustration only, and the terms "upper" and "lower" are not limited to being actually upper and lower in the sense of up and down when the electronic component mounting substrate 1 and other members are used.

In the example illustrated in FIGS. 1A to 3C, the electronic component mounting substrate 1 according to the first embodiment includes two recesses 12 open on the first main surface 11a and side surfaces of the insulating base 11, and a cavity 16 between the two recesses 12 and open on the first main surface 11a. In the example illustrated in FIGS. 1A to 3C, the insulating base 11 of the electronic component mounting substrate 1 according to the first embodiment includes four insulating layers 11c. The recesses 12 are disposed in the first insulating layer 11c from the first main surface 11a, and the cavity 16 is disposed in the first to third insulating layers 11c from the first main surface 11a. Electrodes 14 are disposed on a surface of the second insulating layer 11c from the first main surface 11a. That is, the electrodes 14 are disposed on the bottom surfaces of the recesses 12.

Figure 1A:
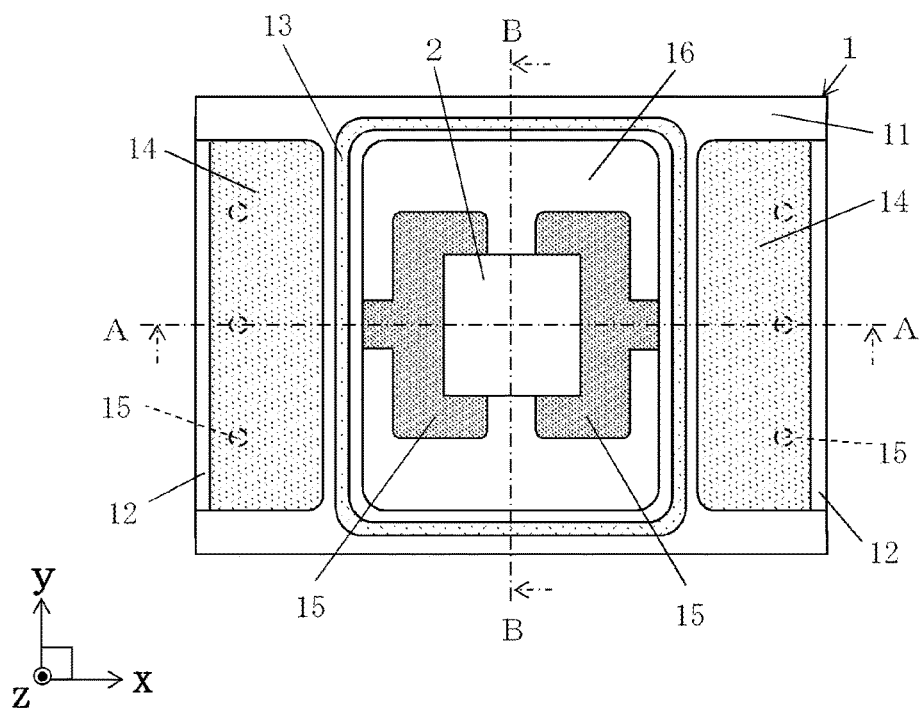
FIG. 1A is a top face view of an electronic device according to a first embodiment of the present invention.
Figure 1B:
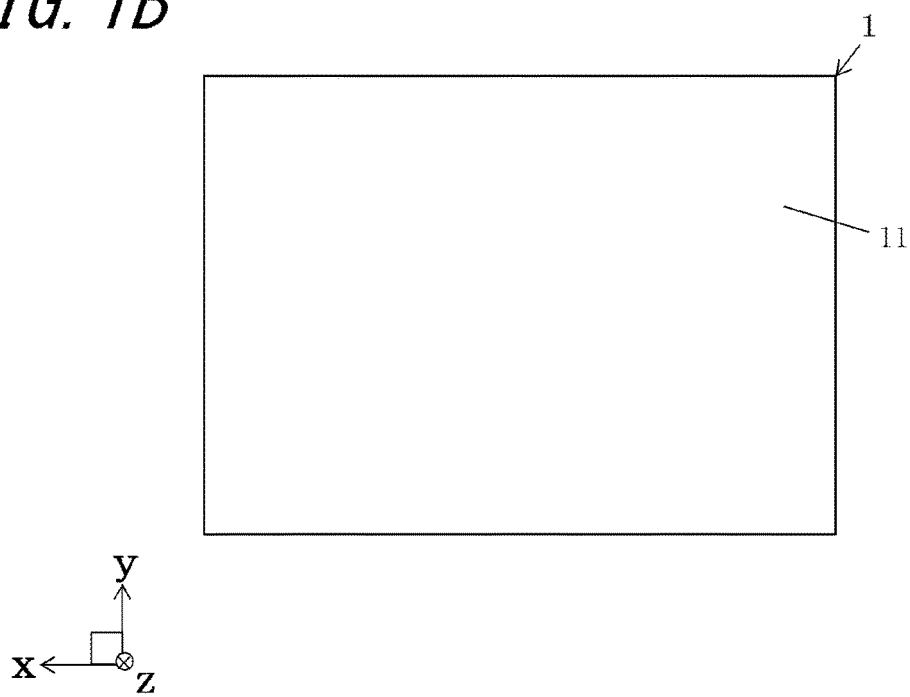
FIG. 1B is a bottom face view of FIG. 1A.
Figure 2:
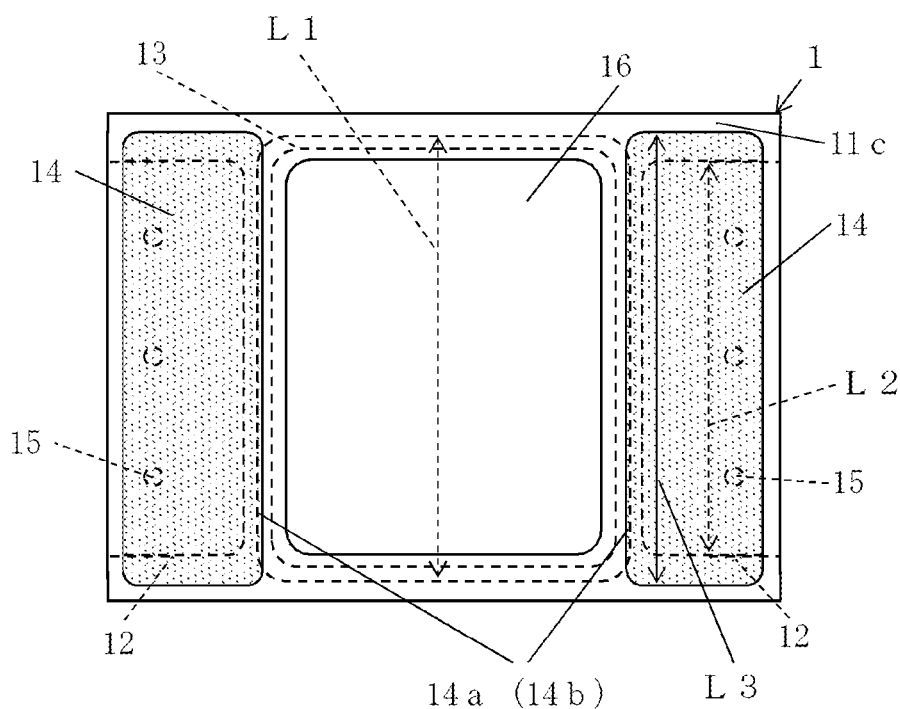
FIG. 2 is an internal top face view of electrodes on an electronic component mounting substrate illustrated in FIGS. 1A and 1B.

In the example illustrated in FIG. 2, inner wall surfaces of the recesses 12 in perspective plan view are indicated by broken lines. In the example illustrated in FIG. 2, side surfaces of via conductors of the wiring conductors 15 in perspective plan view are also indicated by broken lines. In the example illustrated in FIG. 2, an inner periphery and outer periphery of the metal layer 13 in perspective plan view are also indicated by broken lines. In the example illustrated in FIG. 2, ends 14a of the two electrodes 14 overlap the metal layer 13 in perspective plan view.

The insulating base 11 has the first main surface 11a (the top face in FIGS. 1A to 4), the second main surface 11b (the bottom face in FIGS. 1A to 4), and side surfaces. The insulating base 11 includes a plurality of insulating layers 11c, and recesses 12 open on the first main surface 11a and the side surfaces of the insulating base 11. The electrodes 14 to be connected to connection pads 51 on the module substrate 5 are disposed on the bottom surfaces of the recesses 12. The insulating base 11 has a rectangular plate shape in plan view, that is, when viewed in a direction perpendicular to the first main surface 11a and the second main surface 11b. The insulating base 11 also has a cavity 16 open on the first main surface 11a and adjacent to the recesses 12. The insulating base 11 functions as a support for supporting an electronic component 2. The electronic component 2 adheres and is fixed to a bottom surface of the cavity 16 via connection members 3 such as solder bumps, gold bumps, or conductive resin (such as anisotropic conductive resin).

The insulating base 11 may be a ceramic body such as an aluminum oxide sintered body (alumina ceramic body), an aluminum nitride sintered body, a silicon nitride sintered body, a mullite sintered body, or a glass-ceramic sintered body. For example, when the insulating base 11 is an aluminum oxide sintered body, the insulating base 11 is produced as follows. An appropriate organic binder and solvent, for example, are added to a source material powder of aluminum oxide ($Al_2O_3$), silicon oxide ($SiO_2$), magnesium oxide (MgO), or calcium oxide (CaO), for example, and then mixed together to form a slurry. The slurry is formed into a sheet shape by using a known method such as a doctor blade method or a calendar roll method to prepare a ceramic green sheet. Then, the ceramic green sheet is subjected to punching appropriately, and a plurality of the ceramic green sheets is laminated to form a green body. Then, the green body is fired at a high temperature (about 1600° C.) The insulating base 11 is thus obtained.

The recesses 12 or the cavity 16 may be formed by, for example, forming through-holes for the recesses 12 or the cavity in each ceramic green sheet by subjecting some of ceramic green sheets for the insulating base 11 to laser processing, punching with a die, or the like, and laminating the ceramic green sheets on other ceramic green sheets having no through-hole.

The metal layer 13, the electrodes 14, and the wiring conductors 15 are disposed in the insulating base 11 and on a surface of the insulating base 11. The electrodes 14 and the wiring conductors 15 are used to electrically connect the electronic component 2 to the module substrate 5. The metal layer 13 is used as, for example, a bonding portion for bonding a lid 4 to the electronic component mounting substrate 1.

The metal layer 13, the electrodes 14, and the wiring conductors 15 are made by metallization using a metal powder containing, for example, tungsten (W), molybdenum (Mo), manganese (Mn), silver (Ag), or copper (Cu) as a main component. For example, when the insulating base 11 is formed of an aluminum oxide sintered body, a metallization paste obtained by adding, for example, an appropriate organic binder and solvent to a powder of a high-melting-point metal such as W, Mo, or Mn and mixing them together is applied in advance to the ceramic green sheets for the insulating base 11 in a predetermined pattern by printing using screen printing and is then fired simultaneously with the ceramic green sheets for the insulating base 11. Thus, the insulating base 11 is coated with the paste at a predetermined position. The metal layer 13, the electrodes 14, and the wiring conductors 15 are formed by, for example, applying a metallization paste for the metal layer 13, the electrodes 14, and the wiring conductors 15 to the ceramic green sheets for the insulating base 11 by printing using a technique such as screen printing, and firing the paste together with the ceramic green sheets for the insulating base 11. Further, the via conductors serving as the wiring conductors 15 are formed by, for example, forming through-holes for the via conductors by subjecting the ceramic green sheets for the insulating base 11 to a processing method such as punching with a die or a punching machine or laser processing, filling the through-holes with a metallization paste for the via conductors using the printing technique described above, and firing the paste together with the ceramic green sheets for the insulating base 11. The metallization paste is prepared by adding an appropriate solvent and binder to the metal powder described above and kneading the mixture to appropriately adjust the viscosity of the kneaded mixture. The metallization paste may include a glass powder or a ceramic powder to enhance the bonding strength with the insulating base 11.

The metal layer 13 extends in a band shape along a sidewall between the recesses 12 and the cavity 16. In the example illustrated in FIG. 1A, the metal layer 13 extends in a frame shape surrounding the cavity 16. For example, the metal layer 13 is bonded with the lid 4, a frame made of a metal or any other material, or any other member.

The electrodes 14 appear on the bottom surfaces of the recesses 12, and the ends 14a of the electrodes 14 extend into the insulating base 11. That is, the ends 14a of the electrodes 14 extend from the bottom surfaces of the recesses 12 into the insulating base 11. In the first embodiment, the electrodes 14 are used as, for example, outer electrodes to be connected to the connection pads 51 on the module substrate 5. The distance by which the electrodes 14 extend into the insulating base 11, that is, the distance by which the electrodes 14 overlap the insulating base 11 in perspective plan view, is greater than or equal to 50 μm, which may result in appropriate improvement in the strength of the electrodes 14 on the bottom surfaces of the recesses 12. As illustrated in FIG. 2, the electrodes 14 extend into the insulating base 11 in such a manner that each of the electrodes 14 overlaps sidewalls of three sides of the corresponding one of the recesses 12 in plan view, which may result in more appropriate improvement in the strength of the electrodes 14.

As illustrated in FIGS. 2 and 3A to 3C, the ends 14a of the electrodes 14 are disposed in the insulating base 11 and include inclined portions 14b inclined toward the second main surface 11b. With this configuration, for example, the electronic component mounting substrate 1 can suppress a gap between the insulating layers 11c of the insulating base 11 around the electrodes 14, suppress a reduction in airtightness around the electrodes 14 inside the insulating base 11, and suppress a reduction in airtightness around the recesses 12.

Each of the inclined portions 14b has a tapered tip directed toward the second main surface 11b relative to the bottom surface of the recess 12 within the insulating base 11, and the tip of the inclined portion 14b is closer to the second main surface 11b than the bottom surface of the recess 12 when viewed in longitudinal section. The distance by which the electrode 14 overlaps the insulating base 11 is preferably less than or equal to 30% of the width of the sidewall between the recess 12 and the cavity 16.

The inclined portion 14b can be formed by forming an indentation in a ceramic green sheet forming the bottom surface of the recess 12 in advance so as to obtain an inclined end, and applying a metallization paste for the electrode 14 to the indentation by printing. If the distance between the first main surface 11a of the insulating base 11 and the bottom surface of the recess 12 (the depth of the recess 12) is small, the inclined portion 14b can be formed as follows. A ceramic green sheet onto which a metallization paste for the metal layer 13 is printed and a ceramic green sheet onto which a metallization paste for the electrode 14 is printed are prepared. The ceramic green sheets are laminated on each other so that the metallization paste for the metal layer 13 and the metallization paste for the electrode 14 are close to each other in plan view, and are then pressed from both main surfaces to bury the end 14a of the electrode 14 in the ceramic green sheet forming the bottom surface of the recess 12. Thus, the inclined portion 14b can be obtained. In this way, the electrode 14 is formed with a reduced thickness at the inclined portion 14b and with high density, and the tip of the inclined portion 14b is buried toward the second main surface 11b of the insulating base 11, which results in good airtightness around the electrode 14 inside the insulating base 11 and around the electrode 14. Thus, the electronic component mounting substrate 1 can suppress a reduction in airtightness around the recesses 12.

The end 14a of each of the electrodes 14 is located in an area overlapping the metal layer 13 in perspective plan view. The overlapping width of the metal layer 13 and the electrode 14 is less than or equal to 50% of the width of the metal layer 13 in perspective plan view, which enables pressure to be transmitted to the end 14a of the electrode 14, as desired, when ceramic green sheets are pressed from both main surfaces. Thus, the end 14a of the electrode 14 can be more satisfactorily buried in the ceramic green sheet forming the bottom surface of the recess 12.

Exposed surfaces of the metal layer 13, the electrodes 14, and the wiring conductors 15 on the insulating base 11 are coated with metal plating layers using electroplating or electroless plating. The metal plating layers are made of metals having good corrosion resistance and good connection with the connection members 3, such as nickel, copper, gold, or silver. For example, the exposed surfaces are sequentially coated with a nickel plating layer having a thickness of approximately 0.5 to 5 μm and a gold plating layer having a thickness of approximately 0.1 to 3 μm or with a nickel plating layer having a thickness of approximately 1 to 10 μm and a silver plating layer having a thickness of approximately 0.1 to 1 μm. This configuration enables effective suppression of corrosion of the metal layer 13, the electrodes 14, and the wiring conductors 15, and enables secure bonding of the wiring conductors 15 and the connection members 3 such as bonding wires, bonding of the electrodes 14 and the connection pads 51 on the module substrate 5, which are used for connection, and bonding of the metal layer 13 and the lid 4.

The metal plating layers are not limited to a nickel plating layer and a gold plating layer or a nickel plating layer and a silver plating layer, and may be any other combination of metal plating layers such as a nickel plating layer, a gold plating layer, and a silver plating layer or a nickel plating layer, a palladium plating layer, and a gold plating layer.

On the wiring conductors 15 on which the electronic component 2 is mounted, for example, an underlying layer including the nickel plating layer and the gold plating layer, described above, may be coated with a metal plating layer, for example, a copper plating layer having a thickness of approximately 10 to 80 μm, to facilitate appropriate dissipation of heat of the electronic component 2 toward the electronic component mounting substrate 1 through the copper plating layer.

An electronic device can be produced by mounting the electronic component 2 on the bottom surface of the cavity 16 in the electronic component mounting substrate 1. Examples of the electronic component 2 to be mounted on the electronic component mounting substrate 1 include a semiconductor element such as an integrated circuit (IC) chip or a large scale integration (LSI) chip, a light-emitting element, a piezoelectric element such as a crystal oscillator or a piezoelectric oscillator, and various sensors. For example, when the electronic component 2 is a wire-bonding semiconductor element, the semiconductor element is mounted on the electronic component mounting substrate 1 by fixing the semiconductor element to a mounting metal layer by using a bonding member such as a low-melting-point brazing alloy or a conductive resin and then electrically connecting an electrode of the semiconductor element to the wiring conductors via the connection members 3 such as bonding wires. Accordingly, the electronic component 2 is electrically connected to the electrodes 14. For example, when the electronic component 2 is a flip-chip semiconductor element, the semiconductor element is mounted on the electronic component mounting substrate 1 by mechanically and electrically coupling an electrode of the semiconductor element to the wiring conductors 15 via the connection members 3 such as solder bumps, gold bumps, or conductive resin (such as anisotropic conductive resin). A plurality of electronic components 2 may be mounted on the electronic component mounting substrate 1, or a small electronic component such as a resistance element or a capacitance element may be mounted on the electronic component mounting substrate 1, as necessary. The electronic component 2 may be sealed with the lid 4 made of resin or glass, for example, as necessary.

For example, as illustrated in FIG. 4, the electrodes of the electronic device according to this embodiment are connected to the connection pads 51 on the module substrate 5 via the solder 6 to form an electronic module. In the electronic device, for example, as illustrated in FIG. 4, the electrodes 14 on the upper surface side of the electronic component mounting substrate 1 are connected to the connection pads 51 on the module substrate 5.

The electronic component mounting substrate 1 according to this embodiment includes an insulating base 11 having a rectangular shape in plan view and including a first main surface 11a, a second main surface 11b facing the first main surface 11a, and a recess 12 open on the first main surface 11a, a band-shaped metal layer 13 on a sidewall of the recess 12, and an electrode 14 extending from a bottom surface of the recess 12 into the insulating base 11. The electrode 14 has an end 14a disposed in the insulating base 11, and the end 14a includes an inclined portion 14b inclined toward the second main surface 11b. With this configuration, for example, the electronic component mounting substrate 1 can suppress a gap between insulating layers 11c of the insulating base 11 around the electrode 14, suppress a reduction in airtightness around the electrode 14 inside the insulating base 11 and around the electrode 14 by reducing the thickness of the electrode 14 due to the presence of the inclined portion 14b at the end 14a of the electrode 14 and by burying the inclined portion 14b toward the second main surface 11b of the insulating base 11, and suppress a reduction in airtightness around the recess 12.

In addition, the sidewall of the recess 12 and the inclined portion 14b may overlap in perspective plan view. Thus, the inclined portion 14b is satisfactorily buried with a reduced thickness toward the second main surface 11b of the insulating base 11, enabling the electrode 14 to have good airtightness and bonding strength with the insulating base 11.

In addition, the band-shaped metal layer 13 and the inclined portion 14b may overlap in perspective plan view. Thus, if the distance between the first main surface 11a of the insulating base 11 and the bottom surface of the recess 12 (the depth of the recess 12) is small, a ceramic green sheet onto which a metallization paste for the metal layer 13 is printed and a ceramic green sheet onto which a metallization paste for the electrode 14 is printed are prepared, and the ceramic green sheets are laminated on each other so that the metallization paste for the metal layer 13 and the metallization paste for the electrode 14 are close to each other in plan view, and are then pressed from both main surfaces to form the electrode 14 with a reduced thickness at the inclined portion 14b and with high density, enabling the tip of the inclined portion 14b to be buried toward the second main surface 11b of the insulating base 11. The electronic component mounting substrate 1 can provide good airtightness around the electrode 16 inside the insulating base 11 and around the electrode 14 and can suppress a reduction in airtightness around the recess 12.

Overlapping W of the metal layer 13 and the inclined portion 14b in plan view is greater than or equal to a distance H between the metal layer 13 and the electrode 14 in the thickness direction of the insulating base 11 when viewed in longitudinal section (W≥H), which enables pressure to be transmitted from the metal layer 13 to the end 14a of the electrode 14, as desired, when the ceramic green sheets are pressed from both main surfaces. Thus, the electrode 14 can be formed with a reduced thickness at the inclined portion 14b and with high density, and the tip of the inclined portion 14b can be satisfactorily buried toward the second main surface 11b of the insulating base 11.

As in the example illustrated in FIGS. 3A to 3C, the thickness of an insulating layer 11c closer to the first main surface 11a than to the electrode 14 is smaller than the thickness of an insulating layer 11c closer to the second main surface 11b than to the electrode 14, which enables pressure to be more appropriately transmitted from the metal layer 13 to the end 14a of the electrode 14 when the ceramic green sheets are pressed from both main surfaces. Thus, the tip of the inclined portion 14b of the electrode 14 can be satisfactorily buried toward the second main surface 11b of the insulating base 11.

As in the example illustrated in FIG. 2, the band-shaped metal layer 13 and the inclined portion 14b overlap in a band shape along the sidewall of the recess 12. This allows the end 14a of the electrode 14 to include the inclined portion 14b in a band shape along the sidewall of the recess 12. The entire end 14a of the electrode 14 is formed with a reduced thickness and can be buried toward the second main surface 11b of the insulating base 11. The electronic component mounting substrate 1 can provide good airtightness around the electrode 14 inside the insulating base 11 and around the electrode 14 and can suppress a reduction in airtightness around the recess 12.

In this case, as in the example illustrated in FIG. 2, the band-shaped metal layer 13 has a length L1 larger than a length L2 of the recess 12 (L1>L2), which enables the entire end 14a of the electrode 14 to be more effectively formed with a reduced thickness and to be buried toward the second main surface 11b of the insulating base 11.

Furthermore, the length L1 of the band-shaped metal layer 13 and a length L3 of the electrode 14 are longer than the length L2 of the recess 12 (L1>L2 and L3>L2), which enables the entire end 14a of the electrode 14 to be formed with a reduced thickness along the sidewall the recess 12 and the cavity 16 and to be buried toward the second main surface 11b of the insulating base 11. Accordingly, the electronic component mounting substrate 1 can provide good airtightness around the electrode 16 inside the insulating base 11 and around the electrode 14 and can suppress a reduction in airtightness around the recess 12. Preferably, the length L3 of the electrode 14 is longer than the length L1 of the band-shaped metal layer 13 (L3>L1) because the ceramic green sheets can be pressed uniformly along the metal layer 13 when pressed from both main surfaces.

An area of the inclined portion 14b may be included in an area of the sidewall of the recess 12 in perspective plan view. Thus, the inclined portion 14b is satisfactorily buried with a reduced thickness toward the second main surface 11b of the insulating base 11, enabling the electrode 14 to have good airtightness and bonding strength with the insulating base 11.

The electrode 14 may be an outer electrode to be connected to the module substrate 5, the insulating base 11 may include a side surface, and the recess 12 may be a solder deposit portion that is open at the side surface and in which the outer electrode is connected to the module substrate 5 via the solder 6. Thus, if the electrode 14 is subjected to stress due to a difference in thermal expansion between the electronic component mounting substrate 1 and the module substrate 5 when the electronic device is used, the electrode 14 can have good connectivity and airtightness. Thus, the electronic component mounting substrate 1 with high compactness and good mounting reliability and airtightness can be obtained.

An electronic device according to this embodiment includes the electronic component mounting substrate 1 having the configuration described above, and the electronic component 2 on the electronic component mounting substrate 1. Thus, the electronic device can have good long-term reliability.

The lid 4 may be light-transmissive and an optical element such as a light-emitting element may be used as the electronic component 2. In this case, as illustrated in FIG. 4, the module substrate 5 has an opening 52 through which light is transmitted. The opening 52 is larger than the electronic component 2 in plan view.

An electronic module according to this embodiment includes a module substrate 5 including connection pads 51, and an electronic device having the configuration described above, the electronic device being connected to the connection pads 51 via solder 6. Thus, the electronic module can have good long-term reliability.

The electronic component mounting substrate 1 according to this embodiment can be suitably used in a small high-output electronic device, and the connection reliability of the electronic component mounting substrate 1 can be enhanced. For example, when a light-emitting element is used as the electronic component 2, the electronic component mounting substrate 1 can be suitably used in a small light-emitting element mounting substrate.

Second Embodiment

An electronic device according to a second embodiment of the present invention will be described with reference to FIGS. 5A to 7B.

The electronic device according to the second embodiment of the present invention is different from the electronic device according to the first embodiment described above in that the recess 12 is also used as the cavity 16 in which the electronic component 2 is mounted. In the example illustrated in FIG. 6, an inner wall surface of the recess 12 in perspective plan view is indicated by broken lines. In the example illustrated in FIG. 6, side surfaces of via conductors of the wiring conductors 15 in perspective plan view are also indicated by broken lines. In the example illustrated in FIG. 6, an inner periphery and outer periphery of the metal layer 13 in perspective plan view are also indicated by broken lines.

In the example illustrated in FIGS. 5A to 7B, the insulating base 11 of the electronic component mounting substrate 1 according to the second embodiment includes three insulating layers 11c, and the recess 12 is disposed in the first insulating layer 11c from the first main surface 11a, and the electrode 14 is disposed on a surface of the second insulating layer 11c from the first main surface 11a.

Similarly to the electronic component mounting substrate 1 according to the first embodiment, for example, the electronic component mounting substrate 1 according to the second embodiment of the present invention can suppress a gap between the insulating layers 11c of the insulating base 11 around the electrode 14, suppress a reduction in airtightness around the electrode 14 inside the insulating base 11 and around the electrode 14 by reducing the thickness of the electrode 14 due to the presence of the inclined portion 14b at the end 14a of the electrode 14 and by burying the inclined portion 14b toward the second main surface 11b of the insulating base 11, and suppress a reduction in airtightness around the recess 12.

In the second embodiment, the electrode 14 may be a connection electrode to which the electronic component 2 is connected, and the recess 12 may be the cavity 16 in which the electronic component 2 is mounted via the connection electrode. This allows good airtightness between the recess 12 (the cavity 16) and the sidewall of the insulating base 11. Thus, the electronic component mounting substrate 1 can provide good reliability for the electronic component 2.

In the electronic component mounting substrate 1 according to the second embodiment, as in the example illustrated in FIGS. 5A to 7B, the electrode 14 overlaps the metal layer 13 over the entire periphery. This allows the electrode 14 to include an inclined portion 14b disposed in the insulating base 11 along the entire periphery of the sidewall of the recess 12 and inclined toward the second main surface 11b. Accordingly, the electrode 14 can be formed with a reduced thickness at the inclined portion 14b along the entire periphery of the sidewall of the recess 12 and with high density, and the tip of the inclined portion 14b can be buried toward the second main surface 11b of the insulating base 11. Thus, the electronic component mounting substrate 1 can suppress a gap between the insulating layers 11c of the insulating base 11 around the electrode 14, suppress a reduction in airtightness around the electrode 14 inside the insulating base 11, and suppress a reduction in airtightness around the recess 12.

In the electronic component mounting substrate 1 according to the second embodiment, the wiring conductors 15 on the second main surface 11b may be outer electrodes to be connected to the module substrate 5, and are connected to the connection pads 51 on the module substrate 5.

The electronic component mounting substrate 1 according to the second embodiment can be produced using a manufacturing method similar to that of the electronic component mounting substrate 1 according to the first embodiment described above.

The present invention is not limited to the embodiments described above, and a variety of modifications can be made. For example, the insulating base 11 may have a rectangular shape with a cutaway portion or a chamfered portion on a side surface or at a corner in plan view.

In the embodiments described above, the insulating base 11 includes three or four insulating layers 11c, by way of example. The insulating base 11 may include two or five or more insulating layers 11c.

A heat-dissipating substrate larger than the cavity 16 in perspective plan view and exhibiting a higher thermal conductivity than the insulating base 11, such as a heat-dissipating substrate of copper (Cu), copper-tungsten (Cu—W), or copper-molybdenum (Cu—Mo), may adhere to the second main surface 11b of the electronic component mounting substrate 1 according to the first embodiment to dissipate more heat to the second main surface 11b, thereby achieving the electronic component mounting substrate 1, an electronic device, and an electronic module with good long-term reliability.

Figure 8A:
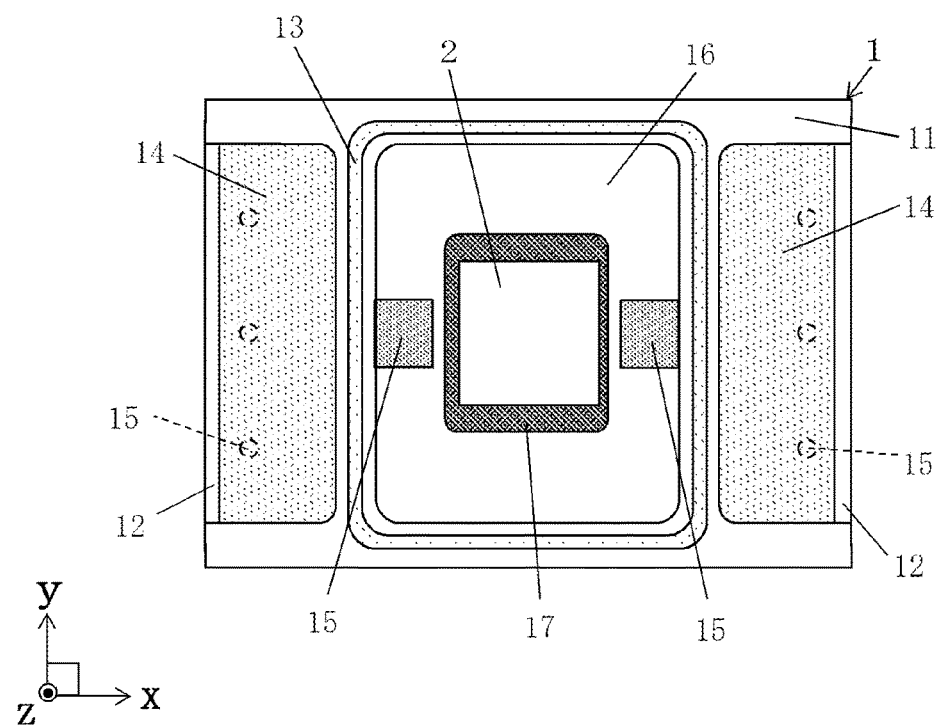
FIG. 8A is a top face view illustrating another example of the electronic device according to the first embodiment of the present invention.
Figure 8B:
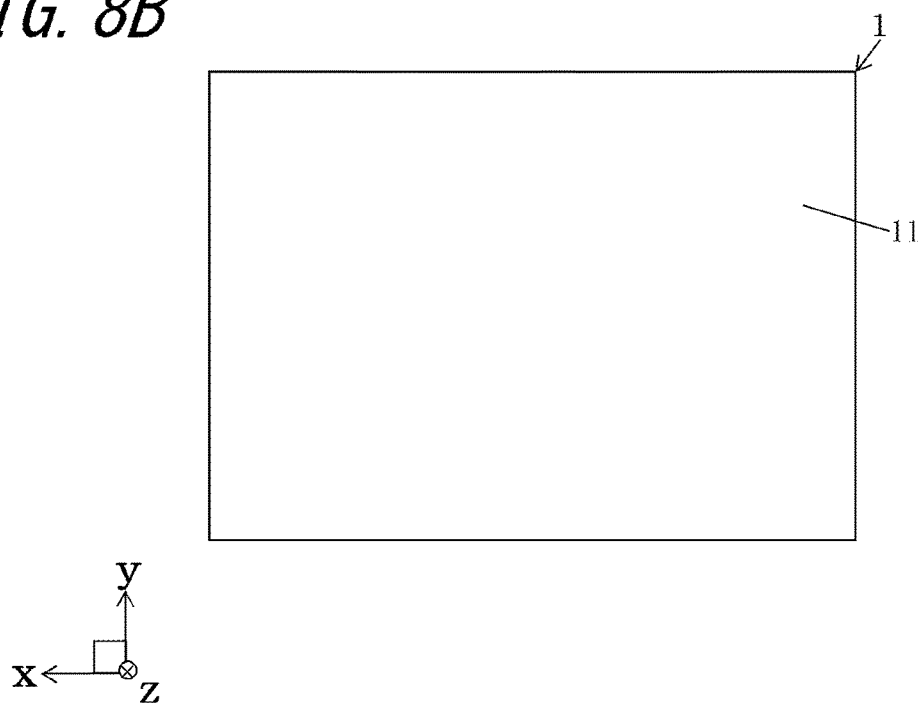
FIG. 8B is a bottom face view of FIG. 8A.
Figure 9A:
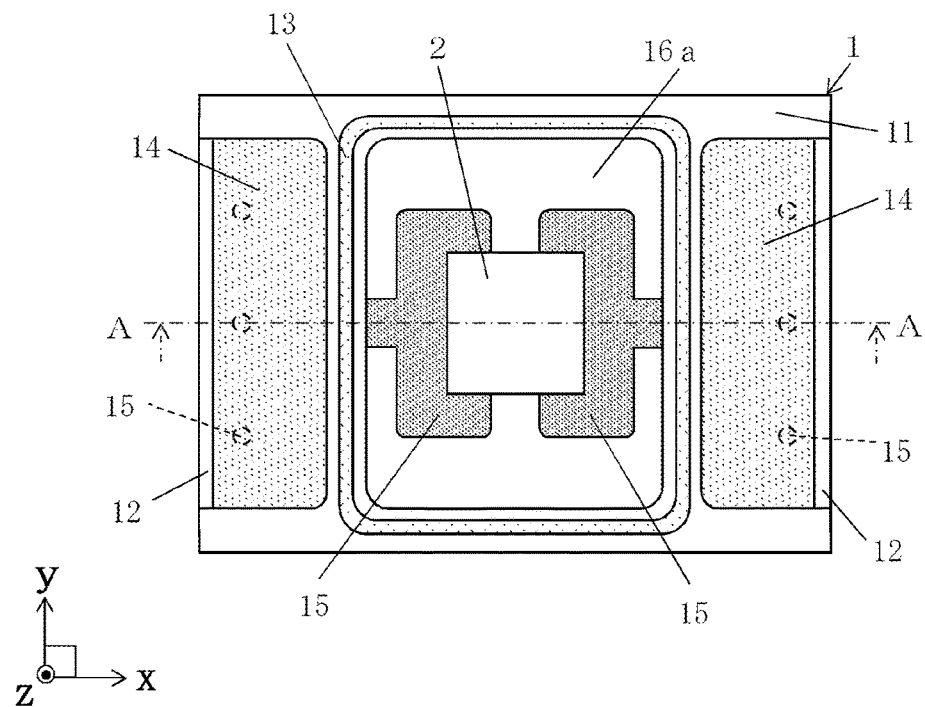
FIG. 9A is a top face view illustrating still another example of the electronic device according to the first embodiment of the present invention.
Figure 9B:
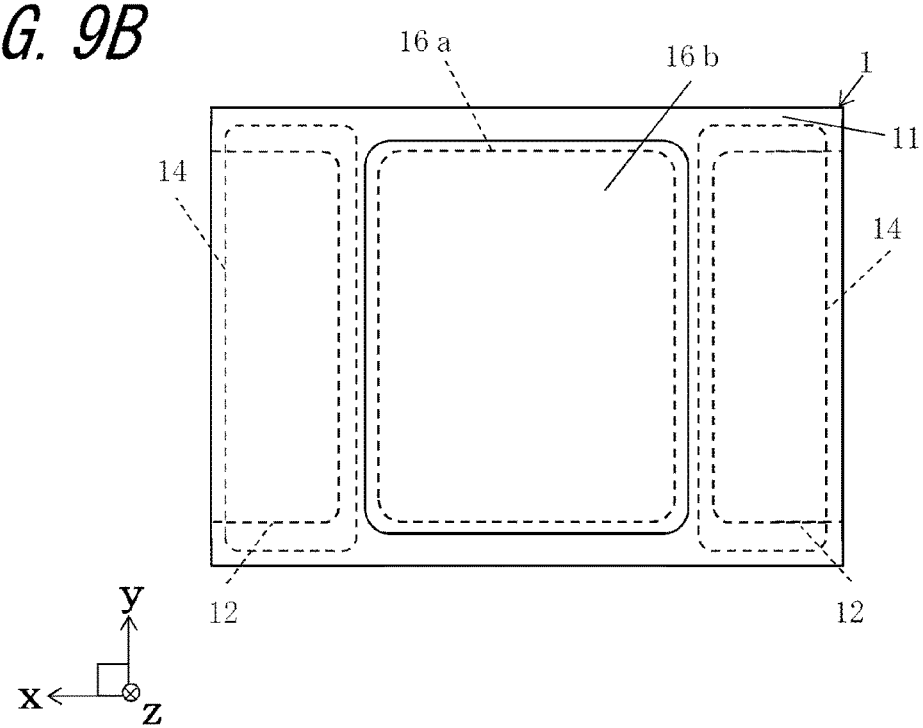
FIG. 9B is a bottom face view of FIG. 9A.
Figure 10A:
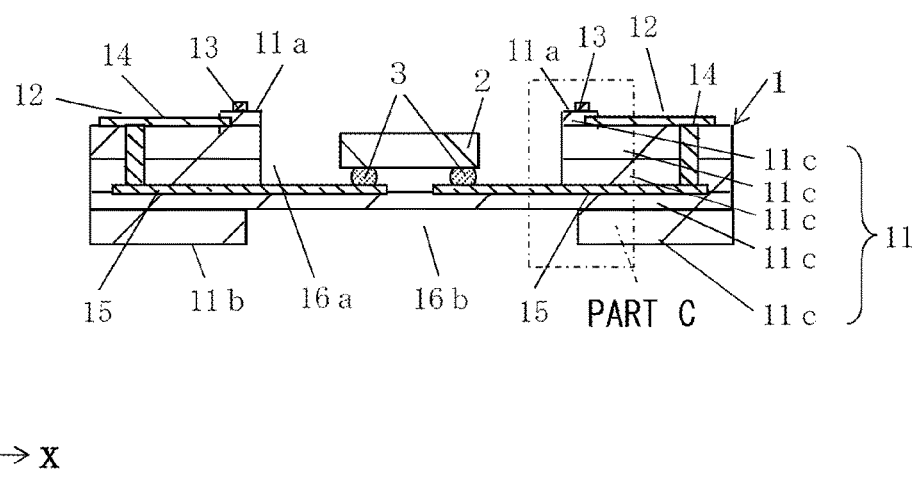
FIG. 10A is a longitudinal sectional view of the electronic device illustrated in FIG. 9A, taken along line A-A.
Figure 10B:
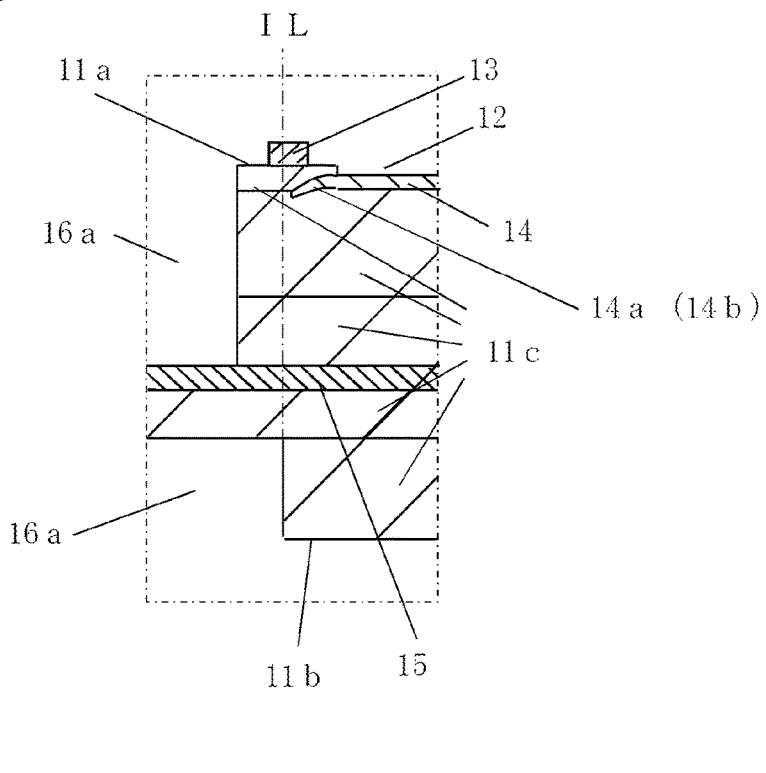
FIG. 10B is an enlarged longitudinal sectional view of part C of the electronic device illustrated in FIG. 10A.

As illustrated in FIGS. 8A and 8B, a mounting metal layer 17 may be disposed on the bottom surface of the cavity 16. The mounting metal layer 17 is formed on the bottom surface of the cavity 16 by using materials and methods similar to those of the metal layer 13, the electrodes 14, and the wiring conductors described above. The mounting metal layer 17 may be connected to the wiring conductors 15.

As illustrated in FIGS. 9A to 10B, the electronic component mounting substrate 1 may have a cavity 16 (16a and 16b) in either main surface of the insulating base 11. In this case, as in the example illustrated in FIGS. 9A to 10B, the cavity 16b in the second main surface 11b does not overlap the end 14a of the electrode 14. That is, an inner wall surface IL of the cavity 16b in the second main surface 11b is closer to the center of the second main surface 11b than the end 14a of the electrode 14. Thus, when the ceramic green sheets are pressed from both main surfaces, the electrode 14 can be formed with a reduced thickness at the inclined portion 14b and with high density, and the tip of the inclined portion 14*b* can be buried toward the second main surface 11*b* of the insulating base 11.

The electronic component mounting substrate 1 according to the first embodiment and the electronic component mounting substrate 1 according to the second embodiment may be combined.

The electronic component mounting substrate 1 may be produced as a multi-cavity electronic component mounting substrate.

What is claimed is:

1. An electronic component mounting substrate comprising:
    an insulating base having a rectangular shape in plan view and comprising a first main surface, a second main surface facing the first main surface, and a recess open on the first main surface;
    a band-shaped metal layer on a sidewall of the recess; and
    an electrode extending from a bottom surface of the recess into the insulating base,
    the electrode comprising an end disposed in the insulating base, the end comprising an inclined portion inclined toward the second main surface, the inclined portion having a tip, a part of which is closer to the second main surface than the bottom surface of recess when viewed in longitudinal section.

2. The electronic component mounting substrate according to claim 1, wherein the sidewall of the recess and the inclined portion overlap in perspective plan view.

3. The electronic component mounting substrate according to claim 2, wherein the band-shaped metal layer and the inclined portion overlap in perspective plan view.

4. The electronic component mounting substrate according to claim 2, wherein an area of the inclined portion is included in an area of the sidewall of the recess in perspective plan view.

5. The electronic component mounting substrate according to claim 1, wherein the band-shaped metal layer and the inclined portion overlap in perspective plan view.

6. The electronic component mounting substrate according to claim 5, wherein an area of the inclined portion is included in an area of the sidewall of the recess in perspective plan view.

7. The electronic component mounting substrate according to claim 1, wherein an area of the inclined portion is included in an area of the sidewall of the recess in perspective plan view.

8. The electronic component mounting substrate according to claim 1, wherein the electrode is an outer electrode to be connected to a module substrate,
    wherein the insulating base further comprises a side surface, and
    wherein the recess is a solder deposit portion that is open at the side surface and in which the outer electrode is connected to the module substrate via solder.

9. The electronic component mounting substrate according to claim 1, wherein the electrode is a connection electrode to which an electronic component is connected, and
    wherein the recess is a cavity in which the electronic component is mounted via the connection electrode.

10. An electronic device comprising:
    the electronic component mounting substrate according to claim 1; and
    an electronic component on the electronic component mounting substrate.

11. An electronic module comprising:
    a module substrate comprising a connection pad; and
    the electronic device according to claim 10, the electronic device being connected to the connection pad via solder.

* * * * *